(12) United States Patent
Cheong et al.

(10) Patent No.: US 8,071,434 B2
(45) Date of Patent: Dec. 6, 2011

(54) METHOD OF FABRICATING A THIN FILM TRANSISTOR USING BORON-DOPED OXIDE SEMICONDUCTOR THIN FILM

(75) Inventors: Woo Seok Cheong, Daejeon (KR); Sung Mook Chung, Gyeonggi-do (KR); Min Ki Ryu, Seoul (KR); Chi Sun Hwang, Daejeon (KR); Hye Yong Chu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/560,702

(22) Filed: Sep. 16, 2009

(65) Prior Publication Data

US 2010/0155716 A1    Jun. 24, 2010

(30) Foreign Application Priority Data

Dec. 18, 2008  (KR) .................. 10-2008-0129691

(51) Int. Cl.
*H01L 21/338* (2006.01)
(52) U.S. Cl. ........ 438/174; 438/149; 438/289; 438/514; 257/E21.413; 257/E21.414
(58) Field of Classification Search .................. 438/141, 438/174, 181, 194; 257/E21.37, E21.4, E21.435
See application file for complete search history.

(56) References Cited

U.S. PATENT DOCUMENTS

| 5,474,941 A | * | 12/1995 | Mitani et al. .................. 438/151 |
| 2002/0055207 A1 | * | 5/2002 | Kunii ............................ 438/151 |
| 2004/0033424 A1 | * | 2/2004 | Talin et al. ........................ 430/5 |
| 2005/0017244 A1 | | 1/2005 | Hoffman et al. |
| 2006/0197087 A1 | * | 9/2006 | Luo et al. ......................... 257/59 |

FOREIGN PATENT DOCUMENTS

| JP | 2000-150900 A | 5/2000 |
| JP | 2002-076356 A | 3/2002 |

OTHER PUBLICATIONS

H. Q. Chiang et al, "High mobility transparent thin-film transistors with amorphous zinc tin oxide channel layer", Applied Physics Letters 86, 013503 (2005).
M. G. McDowell et al, "Combinatorial study of zinc tin oxide thin-film transistors", Applied Physics Letters 92, 013502 (2008).

\* cited by examiner

*Primary Examiner* — Cheung Lee
(74) *Attorney, Agent, or Firm* — Rabin & Berdo, P.C.

(57) ABSTRACT

Provided is a method of fabricating a thin film transistor including source and drain electrodes, a novel channel layer, a gate insulating layer, and a gate electrode, which are formed on a substrate. The method includes the steps of forming the channel layer using an oxide semiconductor doped with boron; and patterning the channel layer. The channel layer formed is an oxide semiconductor thin film doped with boron. The electrical characteristics and high temperature stability of the thin film transistor are improved remarkably.

16 Claims, 8 Drawing Sheets

METHOD OF FABRICATING A THIN FILM TRANSISTOR USING BORON-DOPED OXIDE SEMICONDUCTOR THIN FILM

CROSS-REFERENCE TO RELATED APPLICATION

This application claims the benefit of Korean Patent Application No. 10-2008-0129691, filed Dec. 18, 2008, the disclosure of which is hereby incorporated herein by reference in its entirety.

BACKGROUND

1. Field of the Invention

The present invention relates to a thin film transistor using a boron-doped oxide semiconductor thin film and a method of fabricating the same, and more particularly, to a thin film transistor using a boron-doped oxide semiconductor thin film as a channel layer to remarkably improve electrical characteristics and a method of fabricating the same.

2. Discussion of Related Art

In manufacturing thin film transistors, a ZnO-based material, a non-ZnO-based material and a silicon-based material are mainly used to form a channel layer. These materials will be described in detail.

(1) ZnO-Based Material

Methods of adjusting a ratio of zinc and oxygen (Zn/O) when forming a channel layer using ZnO-based materials have been developed to improve performance of the thin film transistors. For example, the methods may include structural approaches of adjusting a band-gap through substitution of La, Ba, Sr, etc., and methods of adjusting post-processes such as low-temperature annealing and laser annealing.

In addition, the ZnO-based materials have been developed to mitigate deterioration of characteristics due to polycrystalline structure of ZnO. For example, single crystallization is improved through a grain growth method, a low-temperature MBE process, etc., and amorphization is improved using a quaternary material formed of indium, gallium, zinc, and oxygen. However, since the patent related to the quaternary material of indium, gallium, zinc and oxygen has been issued to Hosono, Japan, right of use thereof must be licensed.

Improvement of characteristics through adjustment of concentration of N-type and P-type carriers upon formation of a channel layer using ZnO-based materials is being researched. For example, a single element doping method or a low-cost implantation method is used, and a ternary compound semiconductor, for example, ZnSnO, MgZnO, CdZnO, or the like, is used. There is still much research to be performed on additional substitution to a ternary compound semiconductor.

(2) Non-ZnO-Based Material

Non-ZnO-based materials include an In—Ga—Zn—O type amorphous semiconductor and an individual oxide semiconductor of $In_2O_3$ or $SnO_2$. While it is difficult to avoid Hosono's original patent using the In—Ga—Zn—O type amorphous semiconductor, and the individual oxide semiconductor of $In_2O_3$ or $SnO_2$ has properties lower than that of ZnO, since there has been relatively little research on the amorphous semiconductor, there is a sufficient margin for improvement of the properties through composition adjustment and doping substitution. While there are non-transparent semiconductors such as CdS, ZnS, ZnSe, etc, as non-ZnO-based materials and their properties can be applied to AMOLED, non-transparent properties cause technical restrictions.

(3) Silicon-Based Material

Devices based on amorphous silicon and polysilicon have been implemented. Since an amorphous silicon transistor has a low mobility of about 1 cm/Vs and a polysilicon transistor has a high mobility of about 100 cm/Vs, there may be irregularity in such devices.

The thin film transistors formed of the ZnO-based material, the non-ZnO-based material and the silicon-based material have the following problems.

In the case of the ZnO-based thin film transistors, characteristics of a thin film may vary sensitively depending on humidity in the air, annealing, and manufacturing processes, which may cause stability problems, and a crystalline channel may cause a problem in device uniformity. Meanwhile, deformation of the device due to current and light may be serious.

The thin film transistors having an IGZO channel, in which indium and gallium oxides are applied to ZnO, have problems in that indium and gallium are being exhausted and their prices are high.

In the case of the silicon-based thin film transistors, in particular, the amorphous silicon has a problem of low mobility, and the polysilicon has a problem in uniformity, which causes a disadvantage in a large-sized panel. In particular, stability of the amorphous silicon transistors depending on current is sensitive.

In general, stability of the oxide thin film transistors depending on the current may be sensitive due to a channel thin film or an interface with a gate insulating layer.

In addition, the thin film transistors using ZnS, ZnSe, CdS, etc., are non-transparent, making it difficult to apply them to transparent electronic devices.

For these reasons, the inventors have researched the thin film transistor and discovered that when the channel layer of the thin film transistor is formed using an oxide semiconductor doped with boron, it is possible to improve electrical characteristics and obtain a thin film transistor stable at a high temperature.

SUMMARY OF THE INVENTION

The present invention is directed to a thin film transistor capable of obtaining stability by applying an oxide semiconductor thin film doped with boron to a channel layer.

The present invention is also directed to a method of fabricating a thin film transistor capable of optimizing a fabrication process including forming a channel layer using an oxide semiconductor doped with boron, thereby securing stability.

According to one aspect of the present invention, a thin film transistor includes: source and drain electrodes, a channel layer, a gate insulating layer, and a gate electrode, which are formed on a substrate, wherein the channel layer is an oxide semiconductor thin film doped with boron.

In the thin film transistor in accordance with an exemplary embodiment of the present invention, the channel layer may further include a channel protection layer formed on the channel layer and formed of at least one insulating material selected from the group consisting of AlOx, SiNx and SiOx.

The thin film transistor in accordance with an exemplary embodiment of the present invention may have: a top-gate coplanar structure in which source and drain electrodes, a gate insulating layer and a gate electrode are sequentially formed on a substrate; a top-gate staggered structure in which a channel layer, source and drain electrodes, a gate insulating layer and a gate electrode are sequentially formed on a substrate; a bottom-gate coplanar structure in which a gate electrode, a gate insulating layer, source and drain electrodes, and a channel layer are sequentially formed on a substrate; or a bottom-gate staggered structure in which a gate electrode, a gate insulating layer, a channel layer, and source and drain electrodes are sequentially formed on a substrate.

The oxide semiconductor used in the channel layer of the thin film transistor in accordance with an exemplary embodiment of the present invention may be at least one selected from the group consisting of ZnO, In—Zn—O, Zn—Sn—O, In—Ga—ZnO, Zn—In—Sn—O, In—Ga—O, and $SnO_2$, and the amount of the boron doped on the oxide semiconductor may be 0.001 to 10 at % of the total atomic weight of a metal atom of a metal oxide constituting the oxide semiconductor.

In the thin film transistor in accordance with an exemplary embodiment of the present invention, the gate insulating layer may be formed of at least one insulating material selected from the group consisting of AlOx, SiNx and SiOx.

According to another aspect of the present invention, a method of fabricating a thin film transistor in which source and drain electrodes, a channel layer, a gate insulating layer, and a gate electrode are formed on a substrate includes: forming a channel layer using an oxide semiconductor doped with boron; and patterning the channel layer.

The method may further include forming a channel protection layer on the channel layer using an insulating material, The channel protection layer may be patterned together with the channel layer.

In forming the channel layer, the oxide semiconductor may be at least one selected from the group consisting of ZnO, In—Zn—O, Zn—Sn—O, In—Ga—ZnO, Zn—In—Sn—O, In—Ga—O, and $SnO_2$, and the amount of the boron doped on the oxide semiconductor may be 0.001 to 10 at % of the total atomic weight of a metal atom of a metal oxide constituting the oxide semiconductor.

In the method of fabricating a thin film transistor in accordance with an exemplary embodiment of the present invention, the channel layer may be formed by sputtering, pulse laser deposition (PLD) or ion-beam deposition.

In the method of fabricating a thin film transistor in accordance with an exemplary embodiment of the present invention, the channel protection layer may be formed to a thickness of 1 to 20 nm by chemical vapor deposition (CVD), atomic layer deposition (ALD), or sputtering using at least one insulating material selected from the group consisting of AlOx, SiNx, and SiOx.

In the method of fabricating a thin film transistor in accordance with an exemplary embodiment of the present invention, the channel layer or the channel protection layer may be patterned by photoresist and etched by dry etching, wet etching, or ion milling Or, patterning the channel layer or the channel protection layer may be performed by forming a lift-off pattern using photoresist. The photoresist may be applied at a temperature of less than 150° C.

In the method of fabricating a thin film transistor in accordance with an exemplary embodiment of the present invention, the gate insulating layer may be formed by ALD using at least one insulating material selected from the group consisting of AlOx, SiNx, and SiOx.

BRIEF DESCRIPTION OF THE DRAWINGS

The above and other features of the present invention will be described in reference to certain exemplary embodiments thereof with reference to the attached drawings in which.

DETAILED DESCRIPTION OF PREFERRED EMBODIMENTS

Figure 1A:
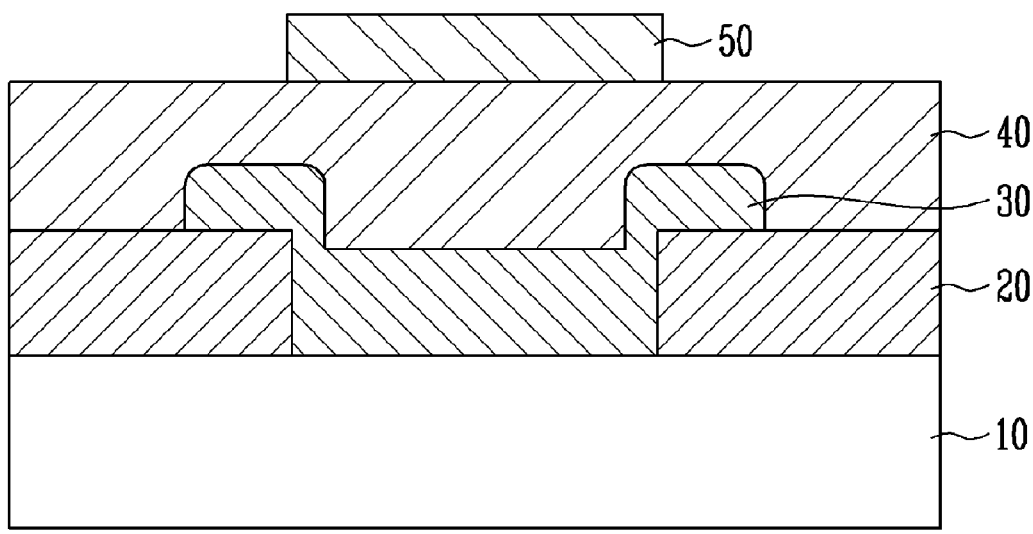
FIGS. 1A to 1D are cross-sectional views of a thin film transistor in accordance with an exemplary embodiment of the present invention.
Figure 1B:
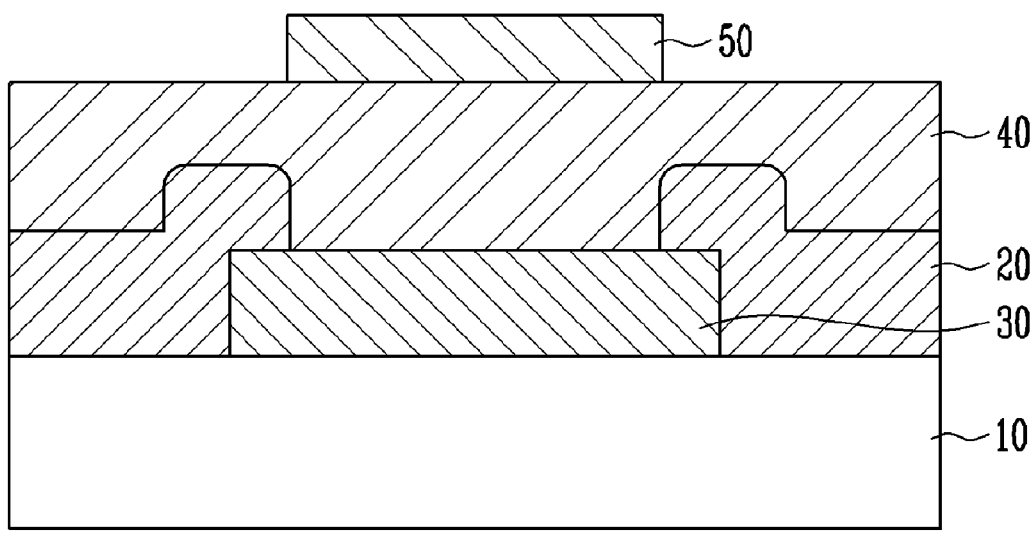
Figure 1C:
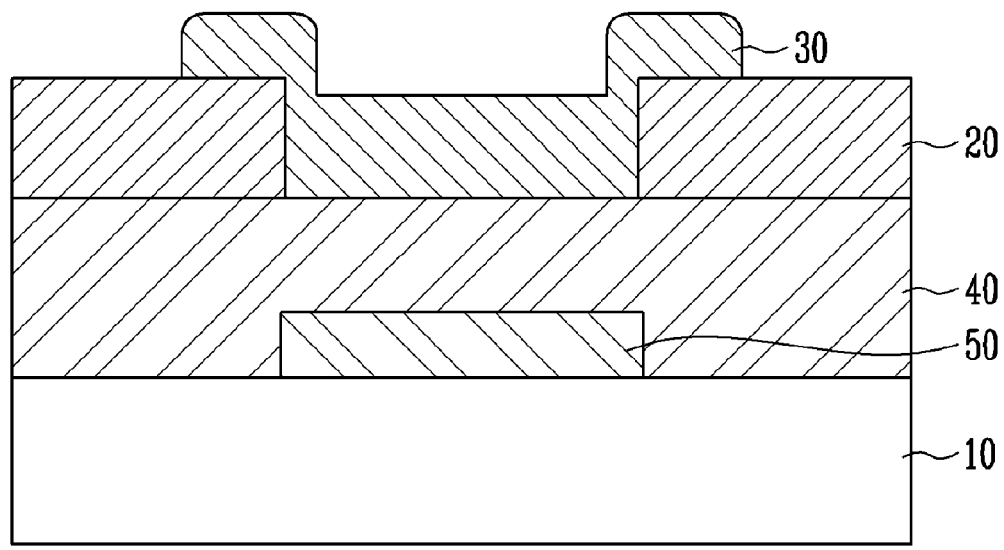
Figure 1D:
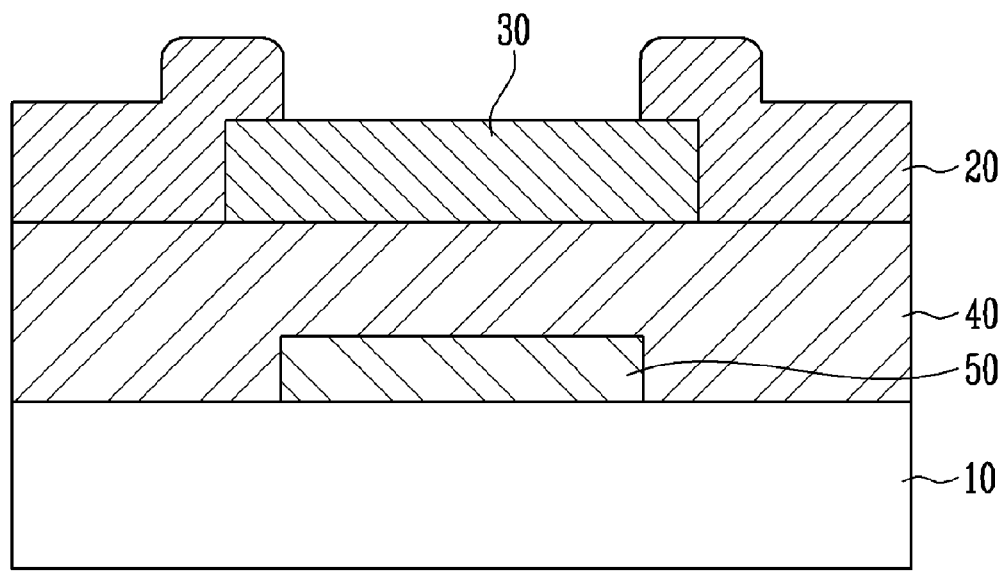

The present invention will be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout the specification.

As shown in FIGS. 1A to 1D, a thin film transistor in accordance with an exemplary embodiment of the present invention may be a top-gate thin film transistor having a coplanar structure in which source and drain electrodes 20, a channel layer 30, a gate insulating layer 40 and a gate electrode 50 are sequentially deposited on a substrate 10 or an inverse-staggered structure in which a channel layer 30, source and drain electrodes 20, a gate insulating layer 40 and a gate electrode 50 are sequentially deposited on a substrate 20. In addition, the thin film transistor in accordance with an exemplary embodiment of the present invention may be a bottom-gate thin film transistor having a coplanar structure in which a gate electrode 50, a gate insulating layer 40, source and drain electrodes 20, and a channel layer 30 are sequentially deposited on a substrate 10, or a staggered structure in which a gate electrode 50, a gate insulating layer 40, a channel layer 30, and source and drain electrodes 20 are sequentially deposited on a substrate 10.

As shown in FIGS. 2A to 2D, a thin film transistor in accordance with another exemplary embodiment of the present invention further includes a channel protection layer A deposited on the channel layer 30.

Figure 2A:
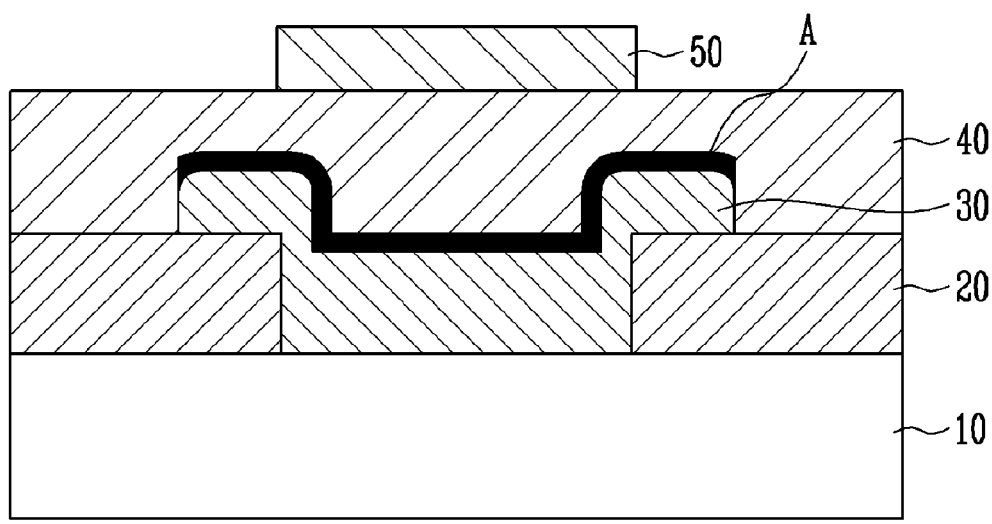
FIGS. 2A to 2D are cross-sectional views of a thin film transistor in accordance with another exemplary embodiment of the present invention.
Figure 2B:
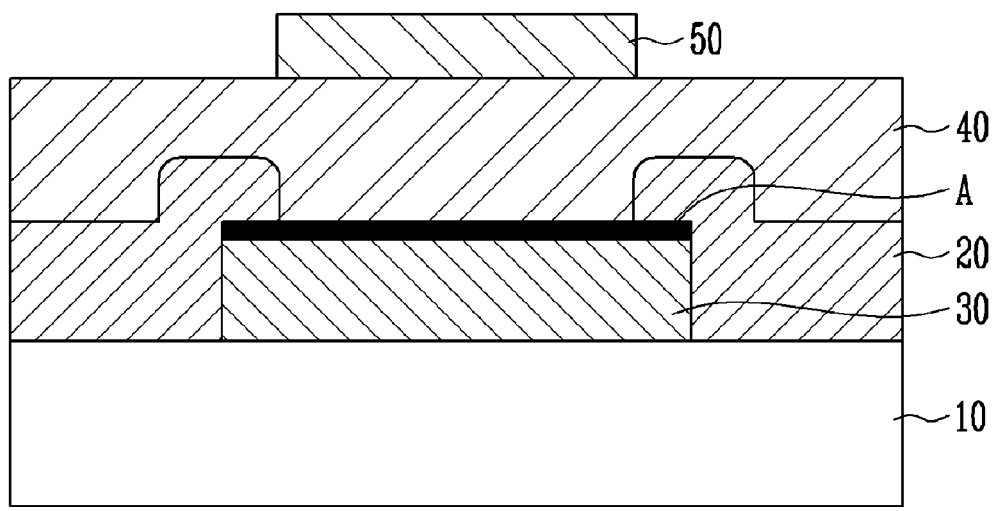
Figure 2C:
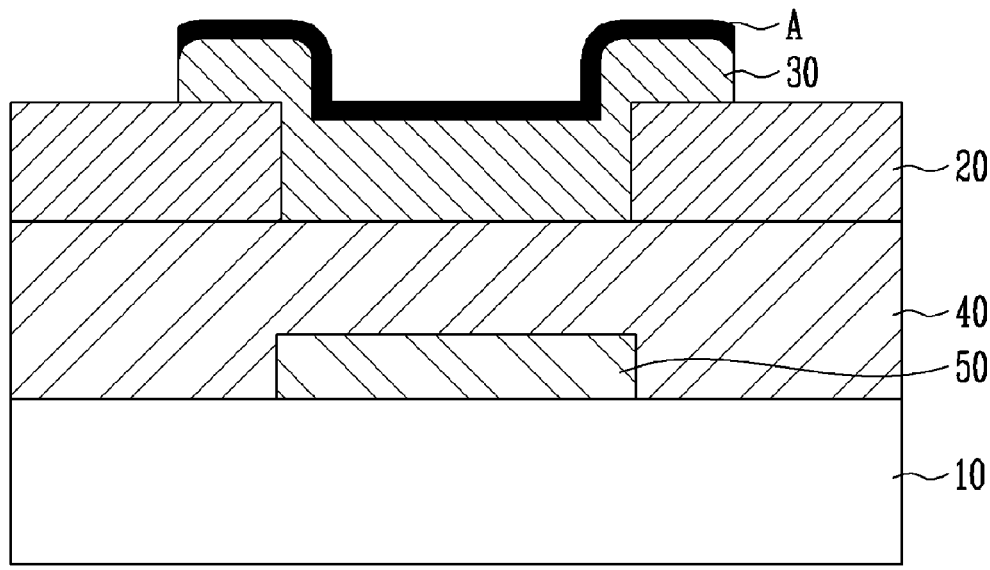
Figure 2D:
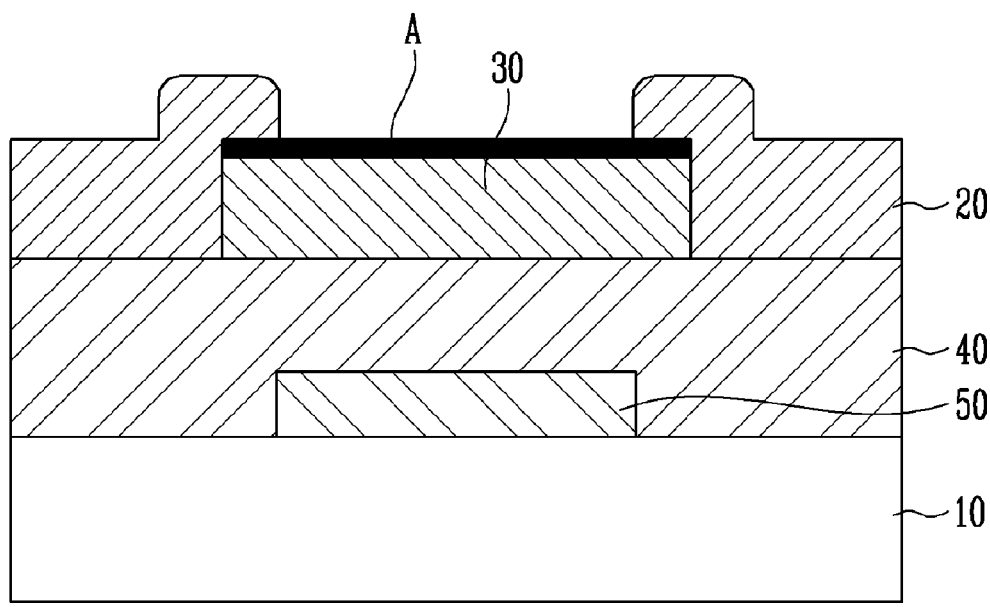

For the sake of convenience, each layer will be described in detail with reference to FIG. 2A. Referring to FIG. 2A, the thin film transistor in accordance with an exemplary embodiment of the present invention includes source and drain electrodes 20, a channel layer 30, a channel protection layer A, a gate insulating layer 40, and a gate electrode 50, which are deposited on a substrate 10.

The substrate 10 may be formed of a material well known in the art, for example, glass, metal foil, plastic or silicon.

The source and drain electrodes 20 formed on the substrate 10 may be formed of transparent oxides such as indium tin oxide (ITO), indium zinc oxide (IZO), ZnO:Al(Ga), etc., metals such as Al, Cr, Au, Ag, Ti, etc., or conductive polymers, but are not limited thereto. In addition, the source and drain electrodes 20 may have a dual structure of the metal and the oxide. The source and drain electrodes 20 are deposited to a conventional thickness in this art using sputtering, atomic layer deposition (ALD), chemical vapor deposition (CVD), etc., and then patterned.

The channel layer 30 is formed at a channel region of the substrate 10 and the source and drain electrodes 20 are deposited to a conventional thickness in this art using an oxide semiconductor doped with boron.

The deposition may use a conventional deposition method in this art, and preferably, sputtering, pulsed laser deposition (PLD), ion beam deposition, or the like. In the case of sputtering deposition, an oxide target to which boron is added may be used, or a boron target and an oxide target may be separately installed and then simultaneously sputtered.

The channel layer 30 may be deposited at a temperature of 450° C. or less, and preferably 150° C. to 450° C. Post-annealing may also be performed within a deposition temperature range.

The oxide semiconductor may be selected from all oxide semiconductor materials such as zinc oxides, tin oxides, indium oxides, gallium oxides, and preferably, ZnO, In—Zn—O($In_2O_3$—ZnO), Zn—Sn—O(ZnO—$SnO_2$), Zn—In—Sn—O(ZnO—$In_2O_3$—$SnO_2$), In—Ga—Zn—O($In_2O_3$—$Ga_2O_3$—ZnO), In—Ga—O($In_2O_3$—$Ga_2O_3$), or $SnO_2$.

Boron doped on the oxide semiconductor may be doped to 0.001 to 10 at % of the total atomic weight of a metal atom of a metal oxide constituting the oxide semiconductor. Addition of boron can increase mobility and stability at a high temperature.

The channel protection layer A may be selectively formed on the channel layer 30. The channel protection layer A is formed to protect the channel layer from etching, etc., the thickness of which is 1 to 20 nm, and may be formed of an insulating material such as AlOx, SiNx or SiOx.

The channel protection layer A may be formed by CVD, ALD, sputtering, or the like.

The channel layer 30 or the channel layer 30 and the channel protection layer A may be patterned by an ion milling, dry etching, wet etching or lift-off method.

The lift-off method may be performed by forming a lift-off pattern using photoresist. Here, since the photoresist is sensitive to a deposition temperature, the lift-off method may be performed at a temperature of less than 150° C.

The gate insulating layer 40 in partial contact with the channel layer 30 is formed by depositing alumina, silicon nitride, or silicon oxide at a temperature of 450° C. or less. Alumina may be deposited using ALD, plasma enhanced chemical vapor deposition (PECVD) or metal organic chemical vapor deposition (MOCVD), preferably ALD, at a temperature of 100 to 250° C. Silicon nitride (SiNx) or silicon oxide (SiOx) may be deposited by PECVD at a temperature of 100 to 300° C. as a low temperature process, or at a temperature of less than 500° C. as a high temperature process. After forming the gate insulating layer 40, the gate insulating layer 40 may be post-annealed at a temperature of 200 to 300° C. to obtain stability.

The gate electrode 50 formed on the gate insulating layer 40 may be formed of transparent oxides such as ITO, IZO, ZnO:Al(Ga), etc., low-resistance metals such as Ti, Ag, Au, Al, Cr, Al/Cr/Al, Ni, etc., or conductive polymers, but is not limited thereto. The gate electrode 50 is deposited to a conventional thickness in the art through a process such as sputtering, ALD, CVD, or the like, and then patterned.

Hereinafter, exemplary embodiments of the present invention will be described in detail.

Embodiment 1

Figure 3:
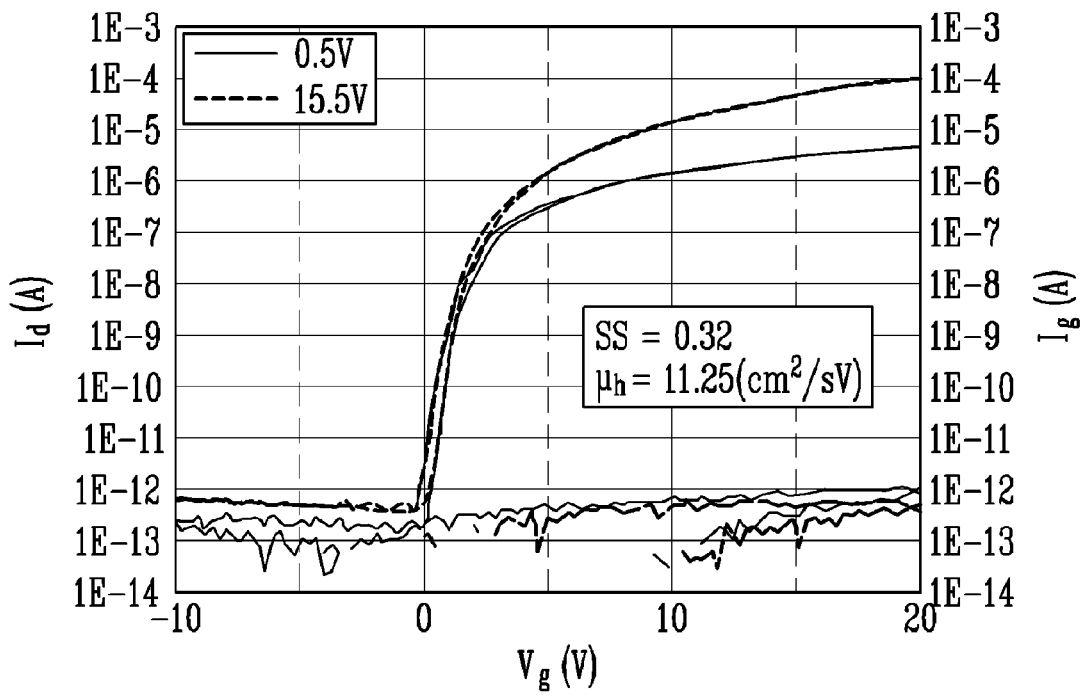
FIG. 3 is a transfer plot of a thin film transistor fabricated in Embodiment 1 of the present invention.

Source and drain electrodes were deposited on a substrate to a thickness of 150 nm using ITO through sputtering, and then, the source and drain electrodes were etched and patterned using a mixed solution of phosphoric acid and nitric acid at a temperature of 50° C. Next, ZTO (Zn:Sn atomic ratio: 3:1) doped with boron of 3.5 at % was deposited on the source and drain electrodes at a normal temperature through sputtering to form a boron-doped ZTO channel layer to a thickness of 20 nm, and then, annealed at a temperature of 400° C. for one hour. Then, a channel protection layer was formed on the channel layer to a thickness of 10 nm using alumina. Next, the channel layer and the channel protection were wet-etched and patterned using a dilute HF solution. Next, a gate insulating layer was formed on the patterned channel layer and channel protection layer to a thickness of 190 nm using alumina through ALD at a temperature of 150° C., and then, the gate insulating layer was etched using phosphoric acid, which was heated to a temperature of 120° C., and then patterned. A gate electrode was deposited on the gate insulating layer to a thickness of 150 nm using ITO through sputtering, and then, etched and patterned using a mixed solution of phosphoric acid and nitric acid at a temperature of 50° C. to fabricate a thin film transistor. Characteristics of the thin film transistor were estimated and the results are shown in FIG. 3. As can be appreciated from FIG. 3, an SS value was 0.32 and mobility was 11.25 $cm^2/sV$.

Comparative Example 1

Figure 4:
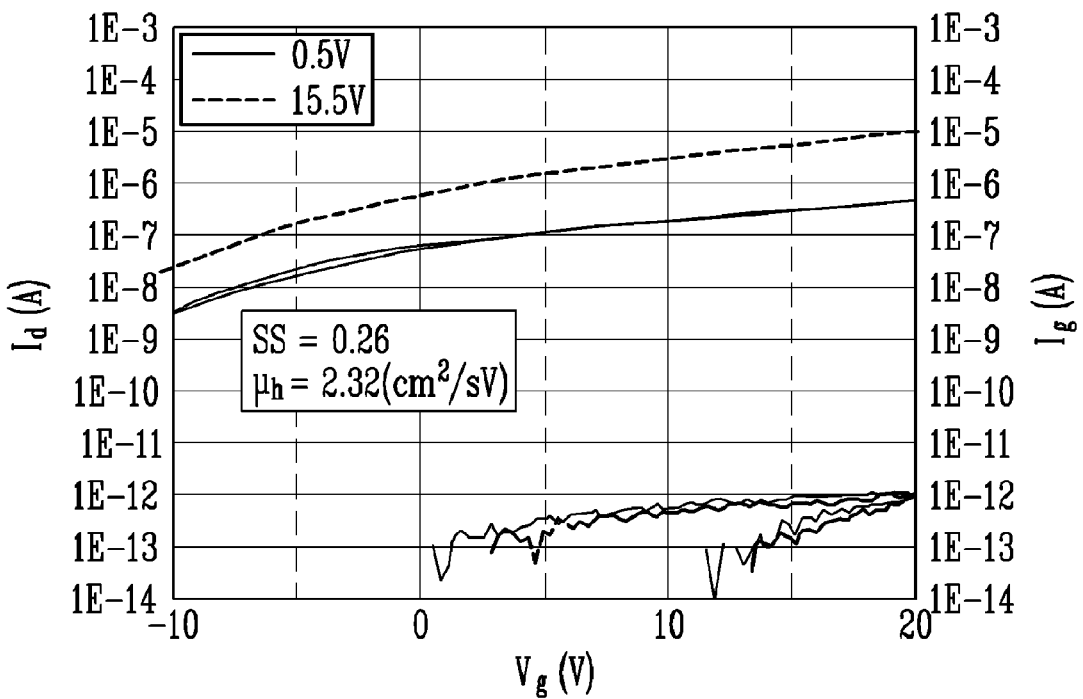
FIG. 4 is a transfer plot of a thin film transistor fabricated in Comparative Example 1 of the present invention.

A thin film transistor was fabricated in the same manner as in Embodiment 1, except that boron was not doped. Characteristics of the fabricated transistor were estimated and the results are shown in FIG. 4. As can be appreciated from FIG. 4, an SS value was 0.26 and mobility was 2.32 $cm^2/sV$.

Comparing Embodiment 1 with Comparative Example 1, it will be appreciated that the thin film transistor of Embodiment 1 in which an oxide semiconductor having boron was applied has high-temperature stability and mobility improved in comparison with a thin film transistor having no boron.

Embodiment 2

Figure 5:
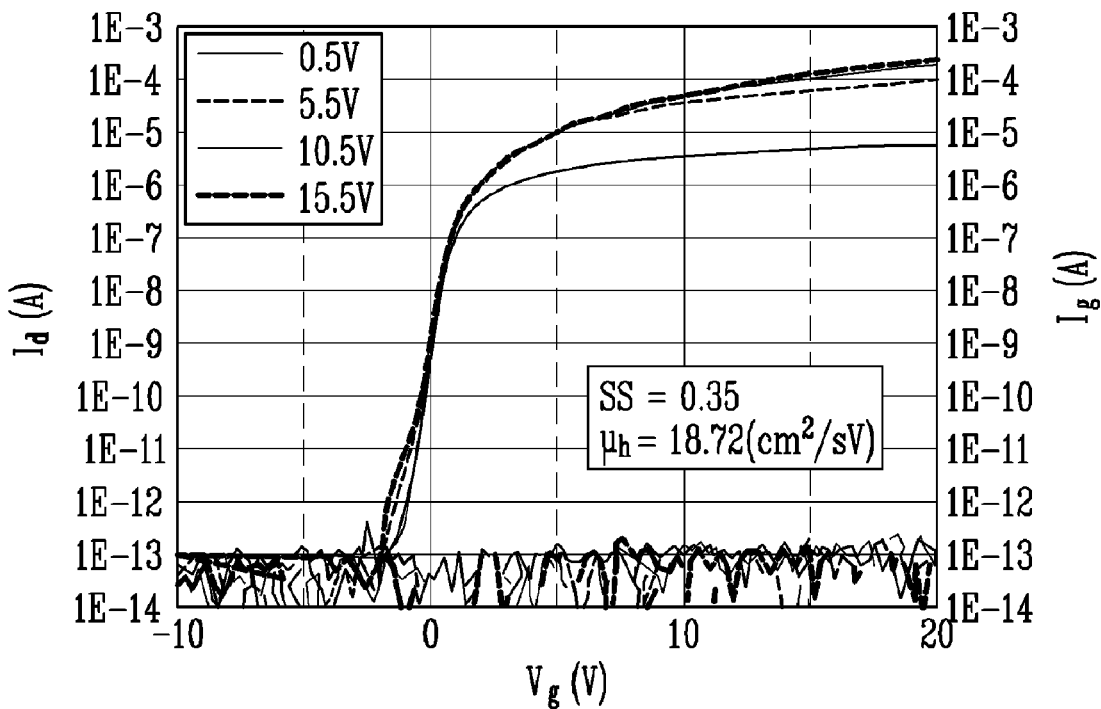
FIG. 5 is a transfer plot of a thin film transistor fabricated in Embodiment 2 of the present invention.

Source and drain electrodes were deposited on a substrate to a thickness of 150 nm using ITO through sputtering, and then, etched and patterned using a mixed solution of phosphoric acid and nitric acid at a temperature of 50° C. Next, a boron-doped ZITO channel layer was formed on the source and drain electrodes at a normal temperature through sputtering to a thickness of 20 nm using ZITO (Zn:In:Sn atomic ratio: 3:2:1) doped with boron of 3.5 at %, and then, annealed at a temperature of 200° C. for one hour. Next, a channel protection layer was formed on the channel layer to a thickness of 10 nm using alumina. Next, the channel layer and the channel protection layer were wet-etched and patterned using a dilute HF solution. Then, a gate insulating layer was formed on the patterned channel layer and channel protection layer using alumina to a thickness of 190 nm at a temperature of 150° C. through ALD, and then, the gate insulating layer was etched and patterned using a phosphoric acid solution, which was heated to a temperature of 120° C. A gate electrode was deposited on the gate insulating layer using ITO to a thickness of 150 nm through sputtering, and then, etched and patterned using a mixed solution of phosphoric acid and nitric acid at a temperature of 50° C. to fabricate a thin film transistor. Characteristics of the fabricated transistor were estimated and the results are shown in FIG. 5. As can be appreciated from FIG. 5, an SS value was 0.35 and mobility was 18.72 cm$^2$/sV.

Embodiment 3

Figure 6:
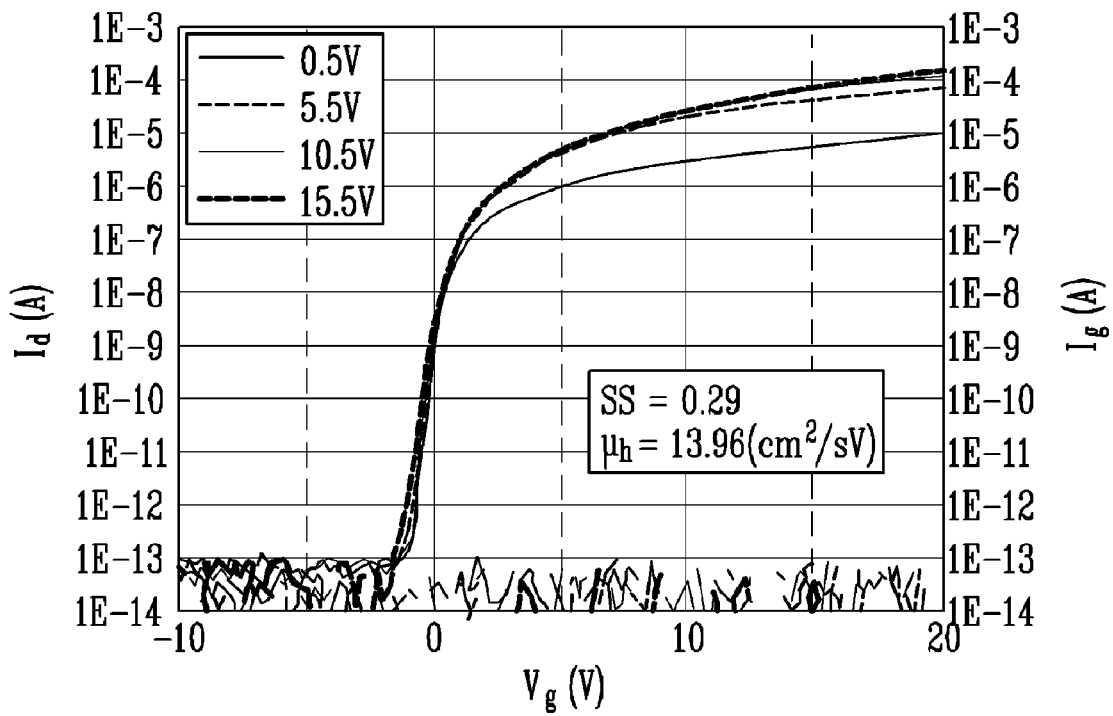
FIG. 6 is a transfer plot of a thin film transistor fabricated in Embodiment 3 of the present invention.

A thin film transistor was fabricated in the same manner as in Embodiment 2, except that annealing was performed at a temperature of 300° C. for one hour upon formation of a channel layer. Characteristics of the fabricated transistor were estimated and the results are shown in FIG. 6. As can be appreciated from FIG. 6, an SS value was 0.29 and mobility was 13.96 cm$^2$/sV.

Comparative Example 2

Figure 7:
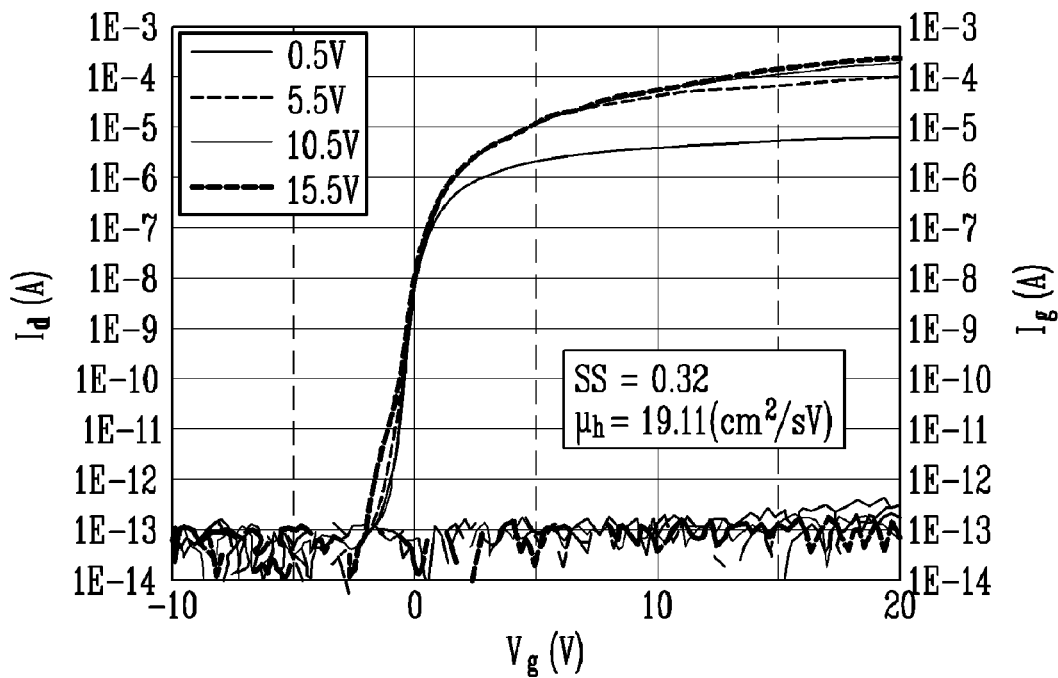
FIG. 7 is a transfer plot of a thin film transistor fabricated in Comparative Example 2 of the present invention.

A thin film transistor was fabricated in the same manner as in Embodiment 2, except that boron was not doped. Characteristics of the fabricated transistor were estimated and the results are shown in FIG. 7. As can be appreciated from FIG. 7, an SS value was 0.32 and mobility was 19.11 cm$^2$/sV.

Comparative Example 3

Figure 8:
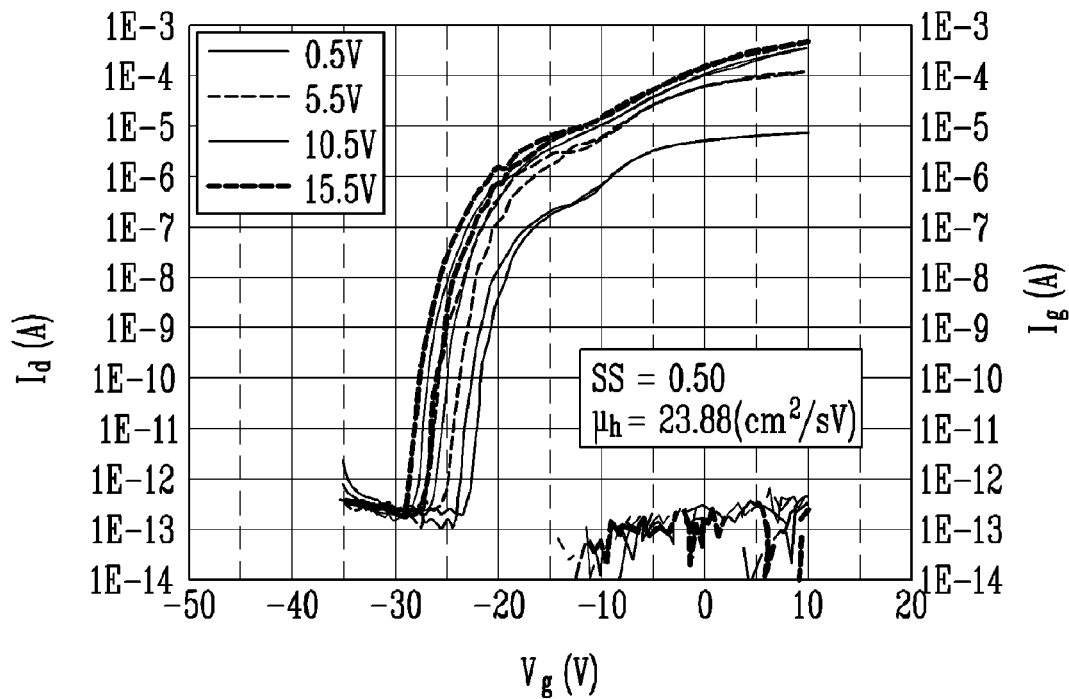
FIG. 8 is a transfer plot of a thin film transistor fabricated in Comparative Example 3 of the present invention.

A thin film transistor was fabricated in the same manner as in Embodiment 3, except that boron was not doped. Characteristics of the fabricated transistor were estimated and the results are shown in FIG. 8. As can be appreciated from FIG. 8, an SS value was 0.50 and mobility was 23.88 cm$^2$/sV.

Comparing Embodiment 2 with Comparative Example 2, it will be appreciated that, when annealing was performed at a temperature of 200° C., there was little difference in characteristics depending on existence of boron. However, comparing Embodiment 3 with Comparative Example 3, it will be appreciated that, after annealing at a temperature of 300° C., a device having no boron had Von largely moved in a negative direction and a channel was branched. On the other hand, it will be appreciated that a device doped with boron was maintained without deterioration of a channel at a high temperature.

Embodiment 4

Figure 9:
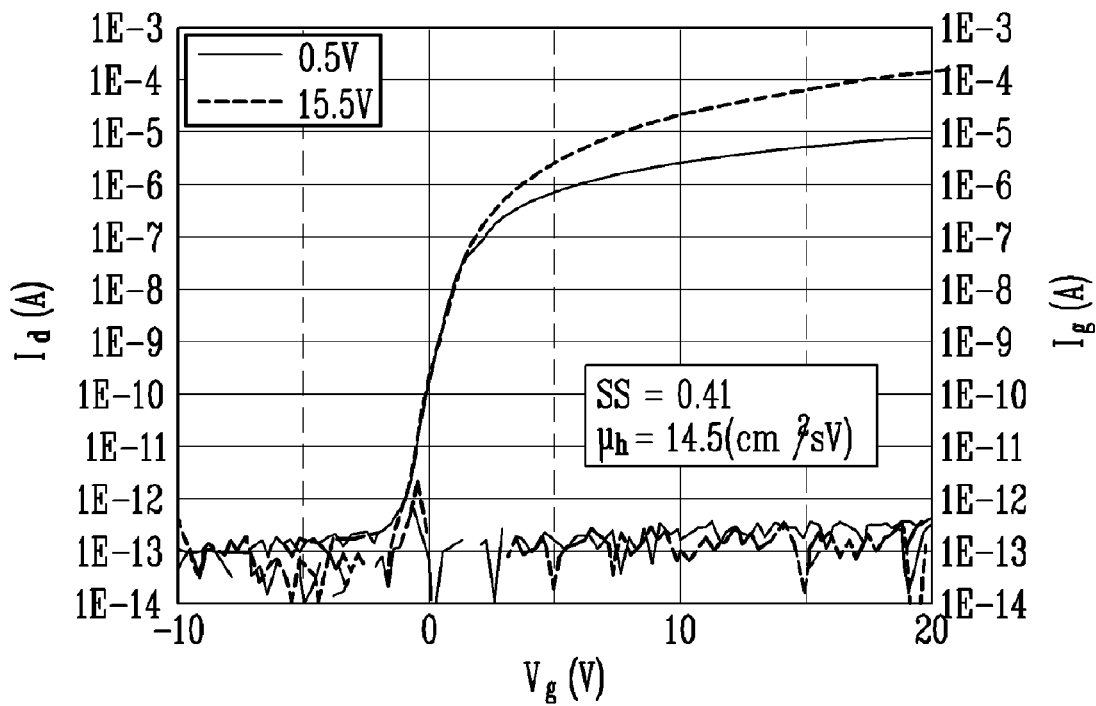
FIG. 9 is a transfer plot of a thin film transistor fabricated in Embodiment 4 of the present invention.

Source and drain electrodes were deposited on a substrate using ITO to a thickness of 150 nm, and then, etched and patterned using a mixed solution of phosphoric acid and nitric acid at a temperature of 50° C. Next, a boron-doped IGZO channel layer was formed on the source and drain electrodes using IGZO (In:Ga:Zn atomic ratio: 1:1:1) doped with boron of 2.0 at % to a thickness of 20 nm at a normal temperature through sputtering, and then, annealed at a temperature of 300° C. for one hour. Next, a channel protection layer was formed on the channel layer using alumina to a thickness of 10 nm. Then, the channel layer and the channel protection layer were wet-etched and patterned using a dilute HF solution. Next, a gate insulating layer was formed on the patterned channel layer and channel protection layer using alumina to a thickness of 190 nm at a temperature of 150° C. through ALD, and then, etched and patterned using a phosphoric acid solution, which was heated to a temperature of 120° C. A gate electrode was deposited on the gate insulating layer using ITO to a thickness of 150 nm through sputtering, and then, etched and patterned using a mixed solution of phosphoric acid and nitric acid at a temperature of 50° C. to fabricate a thin film transistor. Characteristics of the fabricated transistor were estimated and the results are shown in FIG. 9. As can be appreciated from FIG. 9, an SS value was 0.41 and mobility was 14.5 cm$^2$/sV.

Comparative Example 4

Figure 10:
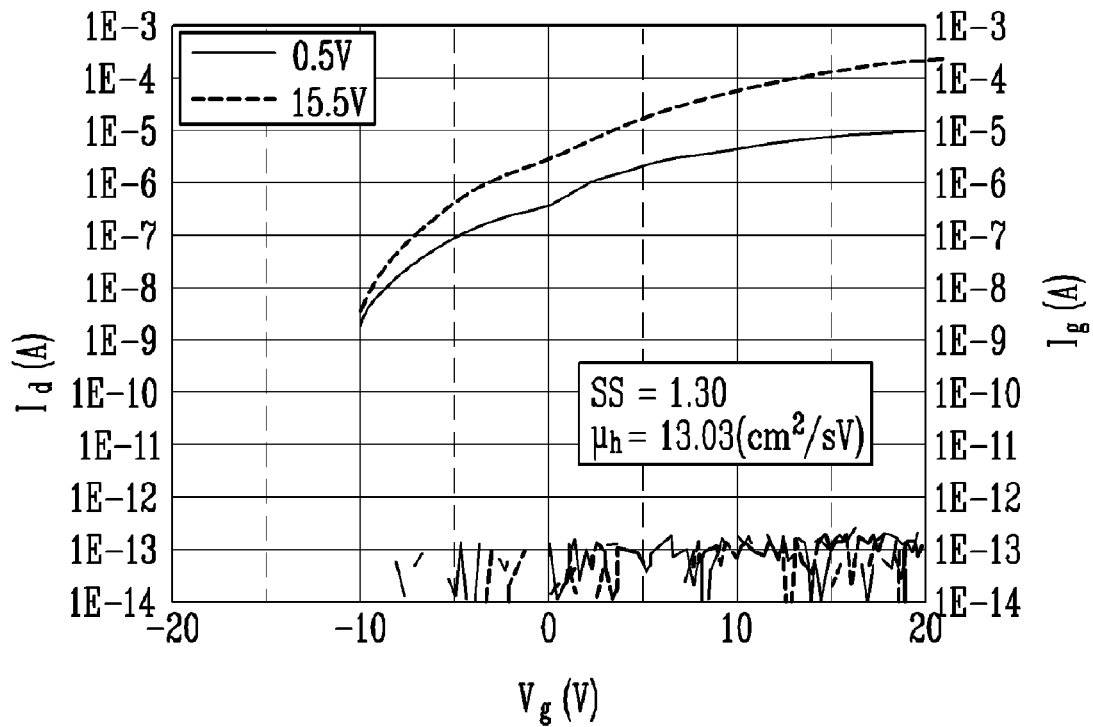
FIG. 10 is a transfer plot of a thin film transistor fabricated in Comparative Example 4 of the present invention.

A thin film transistor was fabricated in the same manner as in Embodiment 4, except that boron was not doped. Characteristics of the fabricated transistor were estimated and the results are shown in FIG. 10. As can be appreciated from FIG. 10, an SS value was 1.30 and mobility was 13.03 cm$^2$/sV.

Comparing Embodiment 4 with Comparative Example 4, Embodiment 4 including boron still maintained depletion of the channel and GI interface, high temperature stability was increased, and mobility was improved.

As described above, the thin film transistor in which a boron-doped oxide semiconductor is applied as a channel layer may be applied to various fields, and may be used for displays and various transparent circuit designs. Examples thereof are a medical transparent display panel, an electronic circuit, an ultraviolet photodetector (UVPD), a transparent light emitting diode (LED), a dual transparent monitor panel, a panel as a drive device for an LCD or an OLED, a transparent radio frequency identification system, a smart window having functions of a transparent glass window and a display, a head-up display (HUD) for an automobile, an aircraft, etc., a head-mounted display (HMD), and a general-purpose display or a transparent flexible display.

As can be seen from the foregoing, the present invention can provide the following effects.

First, an oxide semiconductor doped with boron in accordance with an exemplary embodiment of the present invention can improve electrical characteristics such as mobility to remarkably increase functionality of a device, in comparison with conventional oxide semiconductors.

Second, an oxide semiconductor thin film doped with boron in accordance with an exemplary embodiment of the present invention can increase stability at a high temperature to improve resistance against heat generated during a process.

Third, an oxide semiconductor doped with boron in accordance with an exemplary embodiment of the present invention may be a material of a channel that can secure characteristics of a transparent electronic device at a low cost, thereby reducing use of expensive In, Ga, etc.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating a thin film transistor in which source and drain electrodes, a channel layer, a gate insulating layer, and a gate electrode are formed on a substrate, the method comprising the steps of:

forming said channel layer comprised of an oxide semiconductor doped with boron in which the oxide semiconductor is formed of at least one metal oxide selected from the group consisting of ZnO, In—Zn—O, Zn—Sn—O, In—Ga—ZnO, Zn—In—Sn—O, In—Ga—O, and SnO$_2$, and the boron is present in the oxide semiconductor in an amount ranging from 0.001 to 10 at % of total atomic weight of a metal atom of the metal oxide constituting the oxide semiconductor; and patterning the channel layer.

2. The method according to claim 1, further comprising forming a channel protection layer comprised of an insulating material on the channel layer, wherein the channel protection layer is patterned together with the channel layer.

3. The method according to claim 2, wherein forming the channel layer is performed by one of sputtering, pulse laser deposition (PLD) and ion-beam deposition.

4. The method according to claim 2, wherein the channel protection layer has a thickness ranging from about 1 to about 20 nm, and wherein forming the channel protection layer is performed by one of chemical vapor deposition (CVD), atomic layer deposition (ALD), and sputtering using at least one insulating material selected from the group consisting of AlOx, SiNx, and SiOx.

5. The method according to claim 2, wherein patterning the channel layer and the channel protection layer is performed using photoresist, and etching by one of dry etching, wet etching, and ion milling.

6. The method according to claim 2, wherein patterning the channel layer and the channel protection layer is performed by forming a lift-off pattern using photoresist, and applying the photoresist at a temperature of less than 150° C.

7. The method according to claim 2, further comprising annealing the channel layer at a temperature ranging from 200 to 400° C.

8. The method according to claim 7, wherein forming the channel layer is performed by one of sputtering, pulse laser deposition (PLD) and ion-beam deposition, and wherein the channel protection layer has a thickness ranging from about 1 to about 20 nm, and wherein forming the channel protection layer is performed by one of chemical vapor deposition (CVD), atomic layer deposition (ALD), and sputtering using at least one insulating material selected from the group consisting of AlOx, SiNx, and SiOx.

9. The method according to claim 7, wherein patterning the channel layer and the channel protection layer is performed by one of (a) using photoresist, and etching by dry etching, wet etching, or ion milling, or (b) forming a lift-off pattern using photoresist, and applying the photoresist at a temperature of less than 150° C.

10. The method according to claim 1, wherein forming the channel layer is performed by one of sputtering, pulse laser deposition (PLD) and ion-beam deposition.

11. The method according to claim 1, wherein patterning the channel layer is performed using photoresist, and etching by one of dry etching, wet etching, and ion milling.

12. The method according to claim 1, wherein patterning the channel layer is performed by forming a lift-off pattern using photoresist, and applying the photoresist at a temperature of less than 150° C.

13. The method according to claim 1, wherein forming the channel layer is performed by one of sputtering, pulse laser deposition (PLD), and ion-beam deposition, and wherein patterning the channel layer is performed by one of (a) using photoresist, and etching by one of dry etching, wet etching, and ion milling, and (b) forming a lift-off pattern using photoresist, and applying the photoresist at a temperature of less than 150° C.

14. The method according to claim 1, further comprising the steps of annealing the channel layer at a temperature ranging from 200 to 400° C.; and forming a channel protection layer on the channel layer using an insulating material, wherein the channel protection layer is patterned together with the channel layer.

15. The method according to claim 14, wherein the channel protection layer has a thickness ranging from about 1 to about 20 nm, and wherein forming the channel protection layer is performed by one of chemical vapor deposition (CVD), atomic layer deposition (ALD), and sputtering using at least one insulating material selected from the group consisting of AlOx, SiNx, and SiOx.

16. The method according to claim 14, wherein patterning the channel layer and the channel protection layer is performed by one of (a) using photoresist, and etching by one of dry etching, wet etching, and ion milling, and (b) forming a lift-off pattern using photoresist, and applying the photoresist at a temperature of less than 150° C.

* * * * *